United States Patent
Ono (10) Patent No.: US 7,169,671 B2
(45) Date of Patent: Jan. 30, 2007

(54) METHOD OF RECORDING INFORMATION IN NONVOLATILE SEMICONDUCTOR MEMORY

(75) Inventor: Takashi Ono, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 196 days.

(21) Appl. No.: 11/060,297

(22) Filed: Feb. 18, 2005

(65) Prior Publication Data

US 2006/0008982 A1  Jan. 12, 2006

(30) Foreign Application Priority Data

Jul. 7, 2004  (JP) .............................. 2004-200468

(51) Int. Cl.
*H01L 21/336* (2006.01)

(52) U.S. Cl. .................. 438/266; 438/278; 438/910; 257/317; 257/391; 365/185.14; 365/185.26; 365/185.15

(58) Field of Classification Search .............. 438/289, 438/290, 216–217, 587, 379, 266, 278, 910, 438/FOR. 452; 257/314, 311, 316–317, 257/324, 326, 390, 900, 202, 391; 365/185.14, 365/185.15, 185.26
See application file for complete search history.

(56) References Cited

U.S. PATENT DOCUMENTS

| 4,173,766 | A | 11/1979 | Hayes |
| 4,173,791 | A | 11/1979 | Bell |
| 5,408,115 | A | 4/1995 | Chang |
| 6,255,166 | B1 | 7/2001 | Ogura et al. |
| 6,335,554 | B1* | 1/2002 | Yoshikawa .................. 257/316 |
| 6,670,240 | B2 | 12/2003 | Ogura et al. |
| 7,038,282 | B2* | 5/2006 | Tokui et al. ................. 257/390 |
| 7,050,331 | B2* | 5/2006 | Matsuoka et al. ...... 365/185.05 |
| 7,064,982 | B2* | 6/2006 | Yaoi et al. ............. 365/185.18 |
| 2004/0233714 | A1* | 11/2004 | Morikawa et al. ...... 365/185.04 |
| 2004/0256653 | A1* | 12/2004 | Iwata et al. .................. 257/300 |

FOREIGN PATENT DOCUMENTS

JP  09-252059  9/1997

\* cited by examiner

*Primary Examiner*—Zandra V. Smith
*Assistant Examiner*—Thanh Y. Tran
(74) *Attorney, Agent, or Firm*—Rabin & Berdo, PC (57) ABSTRACT

A nonvolatile semiconductor memory includes a transistor, one or two resistance-change portions, and one or two charge accumulation portions. The transistor has a control electrode, first main electrode region, and second main electrode region. Each resistance-change portion is of a second conductivity type having impurity concentration lower than that of the first and second main electrode regions. The charge-accumulation portions are provided on the associated resistance-change portions. Each charge accumulation portion has an insulating layer, and is capable of accumulating charge.

18 Claims, 5 Drawing Sheets

(FIRST CHARGE ACCUMULATION PORTION)

METHOD OF RECORDING INFORMATION IN NONVOLATILE SEMICONDUCTOR MEMORY

BACKGROUND OF THE INVENTION

1. Field of the Invention

This invention relates to a method of recording information in a nonvolatile semiconductor memory.

2. Description of the Related Art

Because nonvolatile semiconductor memories do not require power to retain stored information, the nonvolatile semiconductor memories are used as memories in portable devices and other equipment with low power consumption. One of recent nonvolatile semiconductor memories has a MONOS (Metal Oxide Nitride Oxide Semiconductor) type memory cell structure with two or more gate electrodes (see for example U.S. Pat. No. 5,408,115, U.S. Pat. No. 6,255,166, and Japanese Patent Kokai (Laid-open Application) No. 09-252059). Such MONOS type memory cells include a transistor having an ordinary gate insulating film, and another transistor having another type of gate insulating film (i.e., ONO (Oxide Nitride Oxide)-layered insulating film that can accumulate electric charge). These two transistors are separately provided in a channel formation region of the memory cell.

For the nonvolatile semiconductor memory disclosed in U.S. Pat. No. 5,408,115 and U.S. Pat. No. 6,255,166, it is necessary that the channel density be optimized individually in the channel formation region below the ordinary gate insulating film and below the ONO-layered insulating film. In order to apply separate voltages to the two gate electrodes, voltage generation circuits, decoders, and other peripheral circuitry are necessary for the two gate electrodes respectively. This results in greater device complexity. Further, the mechanism to operate the memory tends to be more complex, and it is difficult to simply and efficiently inject charge into the ONO-layered insulating film.

Because this memory cell structure has at least two gate electrodes and corresponding gate insulating films that contain an ONO-layered insulating film, the memory cell structure is complex, and manufacturing costs are high.

The inventors have already conducted studies on nonvolatile semiconductor memories that would be operated by simpler methods and be manufactured at reduced costs. The inventors filed a patent application in Japan (Japanese Patent Application No. 2003-293648; hereafter referred to as "the preceding application") covering a portion of the results of these studies.

To aid understanding of the present invention, the structure of nonvolatile semiconductor memory cells disclosed in the preceding application is described below, with reference to FIG. 1 and FIG. 2 of the accompanying drawings.

Figure 1:
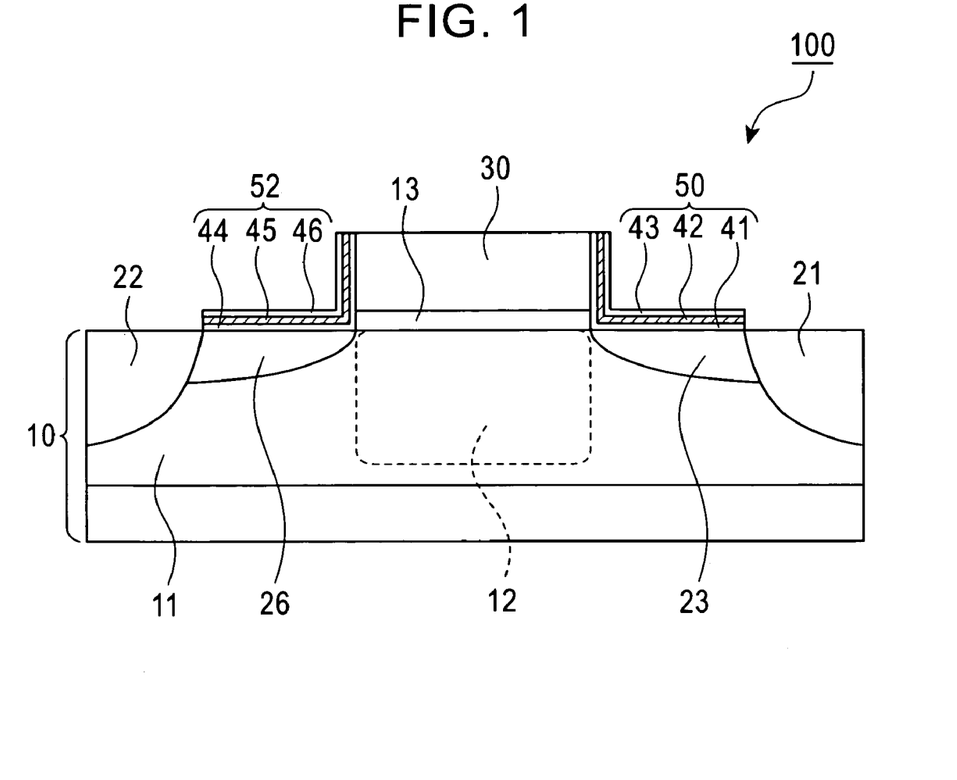
FIG. 1 is a schematic cross-sectional view of the principal portions of a nonvolatile semiconductor memory disclosed in a preceding application.

FIG. 1 is a schematic cross-sectional view of a nonvolatile semiconductor memory cell 100 in the preceding application. A drain region 21 and source region 22, formed by an n+ diffusion layer in the p well 11 formed in a p-type silicon substrate 10, exist separately. Between the drain region 21 and source region 22, a channel formation region 12 is positioned. A gate insulating film 13 is formed on the channel formation region 12, and a gate electrode 30 is formed on the gate insulating film 13. By forming, on the p well 11 of the p-type silicon substrate 10, a gate electrode 30, gate insulating film 13, and drain region 21 and source region 22 of an n+ diffusion layer, the p-type silicon substrate 10 includes an NMOS FET (n-type Metal Oxide Semiconductor Field Effect Transistor).

A first resistance-change portion 23 is formed between the drain region 21 and the channel formation region 12. On the first resistance-change portion 23 is positioned a first charge accumulation portion 50. The first charge accumulation portion 50 includes a silicon oxide film (first oxide film) 41, a silicon nitride film 42, and another silicon oxide film (second oxide film) 43. A second resistance-change portion 26 is provided between the source region 22 and the channel formation region 12. On the second resistance-change portion 26 is positioned a second charge accumulation portion 52. The second charge accumulation portion 52 includes a silicon oxide film (first oxide film) 44, a silicon nitride film 45, and another silicon oxide film (second oxide film) 46.

Hot carriers are injected into the first charge accumulation portion 50 or the second charge accumulation portion 52 to accumulate charge, thereby recording information. That is, by associating a state in which charge is not accumulated and a state in which charge is accumulated with the logical values "0" and "1" or vice versa, one bit of information can be recorded. Whether charge is accumulated in the first charge accumulation portion 50 can be determined by utilizing the following phenomenon. When charge is accumulated in the first charge accumulation portion 50, the resistance of the first resistance-change portion 23 rises, so that the current is reduced, and when charge is not accumulated in the first charge accumulation portion 50, the resistance value of the first resistance-change portion 23 is comparatively low so that the current is increased.

Charge is accumulated by applying a positive voltage to the drain region 21 and gate electrode 30, and setting the source region 22 to ground potential.

The foregoing has described when information is recorded in the first charge accumulation portion 50. Similar description can be applied when information is recorded in the second charge accumulation portion 52. By using a nonvolatile semiconductor memory cell of the preceding application, information can be recorded to and read from each of the first and second charge accumulation portions 50 and 52, so that two bits of information can be recorded to and read from a single nonvolatile semiconductor memory cell. Hence in a memory cell array having a plurality of nonvolatile semiconductor memory cells, the information recording density per unit area can be increased. As a result, the cost of manufacture of a memory cell array necessary for recording the same amount of information can be reduced.

Figure 2:
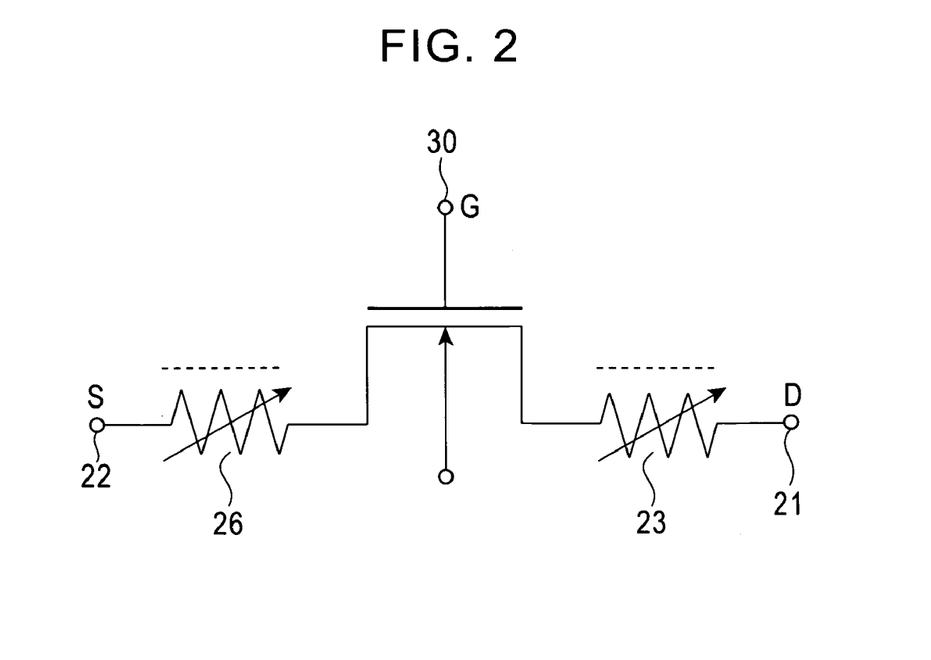
FIG. 2 is an equivalent circuit diagram of the nonvolatile semiconductor memory shown in FIG. 1.

FIG. 2 shows an equivalent circuit diagram of the memory cell 100 shown in FIG. 1. In this circuit, a first resistance-change portion 23 and second resistance-change portion 26 are connected, as variable resistances, to the drain (D) region 21 and source (S) region 22 of the NMOS structure of the memory cell 100.

In the nonvolatile semiconductor memory cell of the preceding application, it is normally necessary that a current of 100 µA or greater flow during charge accumulation. Thus, the power consumption is great. In the nonvolatile semiconductor memory disclosed in Japanese Patent Kokai No. 09-252059, the efficiency of injection of hot carriers is raised by causing a large current to flow. Consequently the power consumption is increased. So, further study is necessary on the problem of large power consumption.

SUMMARY OF THE INVENTION

One object of the invention is to provide a method for recording information to a nonvolatile semiconductor memory cell with good current efficiency.

According to one aspect of the present invention, there is provided an improved method for recording information in a nonvolatile semiconductor memory. The nonvolatile semiconductor memory includes a transistor, one or two resistance-change portions, and one or two charge accumulation portions. The resistance-change portions are associated with the charge accumulation portions. The transistor includes a control electrode, a first main electrode region and a second main electrode region.

The control electrode is provided on semiconductor substrate of a first conductivity type, with a first insulating film being provided between the control electrode and the semiconductor substrate. The first and second main electrode regions are surface regions of the semiconductor substrate, and are a pair of diffusion regions having impurities of a second conductivity type. The second conductivity type differs from the first conductivity type. The control electrode is located between the first and second main electrode regions. A channel formation region in the substrate faces the control electrode.

If two resistance-change portions are provided, one of them is provided in the surface region of the semiconductor substrate between the first main electrode region and the channel formation region, and the other is provided in the surface region of the semiconductor substrate between the second main electrode region and the channel formation region. Each resistance-change portion is of a second conductivity type, with impurity concentration lower than in the first (or second) main electrode region.

If two resistance-change portions are provided, the two charge accumulation portions are provided on the two resistance-change portions, respectively. Each charge accumulation portion has an insulating layer, and is capable of charge accumulation.

If one resistance-change portion is provided, it is provided either on the first main electrode region side or the second main electrode region side.

It should be assumed that information is recorded in one charge accumulation portion of the nonvolatile semiconductor memory in which information has been erased by accumulating charge in advance in the charge accumulation portion concerned. If the first type conductivity is the p type and the second type conductivity is the n type, the information recording method includes applying a high positive voltage to one of the main electrode regions associated with the charge accumulation portion concerned, setting at ground voltage the other main electrode region, and applying a positive voltage to the control electrode to cause weak inversion of the channel formation region.

In this method, a positive voltage is applied to the control electrode to cause weak inversion of the channel formation region. Consequently, compared with a case in which a voltage equal to or greater than the threshold voltage is applied to the control electrode, the current flowing between source and drain can be reduced, and information writing (i.e., charge neutralization) with good current efficiency can be achieved. If information has been erased by accumulating electrons in the charge accumulation portion, injection of hot holes is no longer possible when there are no electrons in the charge accumulation portion. Hence when for example the charge accumulation portion includes an ONO-layered insulating film, degradation of the silicon oxide film of the charge accumulation portion due to hot holes can be held to a minimum.

If the first conductivity type is the n type and the second conductivity type is the p type, the information recording method includes applying a high negative voltage to one main electrode region associated with the charge accumulation portion concerned, setting at ground voltage the other main electrode region, and applying a negative voltage to the control electrode to cause weak inversion of the channel formation region.

These and other objects, aspects and advantages of the present invention will become apparent to those skilled in the art from the following detailed description and appended claims when read and understood in conjunction with the accompanying drawings.

DETAILED DESCRIPTION OF THE INVENTION

Below, embodiments of the present invention are described with reference to the drawings. Configurations and positional relations are described only generally to the extent necessary to aid understanding of the invention. Preferred examples of the invention are also described below, but the numerical conditions and similar are merely examples. Hence this invention is not limited to the following embodiments and examples.

First Embodiment

Figure 3:
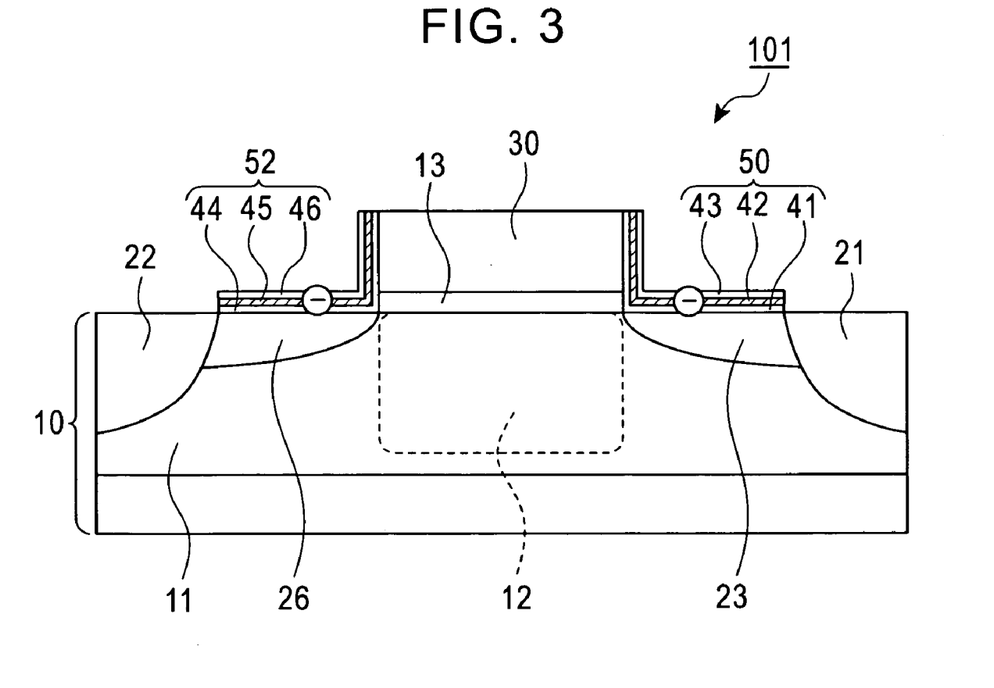
FIG. 3 is a schematic cross-sectional view used to explain the operation of a nonvolatile semiconductor memory according to a first embodiment of the present invention.

Referring to FIG. 3, a nonvolatile semiconductor memory (hereafter, sometimes simply referred to as "memory") 101 of the first embodiment is described. In this embodiment, it should be assumed that the first conductivity type is the p type, and the second conductivity type is the n type.

A p well 11 is formed on the surface region side of the p type silicon substrate 10. A drain region 21, as a first main electrode region, and a source region 22, as a second main electrode region are formed from an n+ diffusion layer and are provided in the surface region of the p well 11. The drain region 21 is separated from the source region 22 by a prescribed distance. As is well known, metal electrode layers are provided on each of the drain region 21 and source region 22, with contact layers intervening. The contact layers and metal electrode layers constitute the source electrode and drain electrode. In the following description, the terms "source region" and "drain region" are used, but these are equivalent to the source electrode and drain electrode respectively.

A gate electrode 30, which is a control electrode, is formed in a certain region in the p well 11 between the drain region 21 and source region 22, with the gate insulating film 13 intervening. The gate insulating film is a first insulating film. By forming a gate electrode 30, gate insulating film 13, and drain region 21 and source region 22 which are n+ diffusion layers on a p well 11 of the p-type silicon substrate 10, the p-type silicon substrate 10 includes an NMOS FET (n-type Metal Oxide Semiconductor Field Effect Transistor).

Of the surface region portions of the p well 11, the portion opposing the gate electrode 30 is the channel formation region 12 to form a channel (current path) between the source and drain regions at the time of NMOS operation.

In this embodiment, the gate oxide film 13 is a silicon oxide film, and the gate electrode 30 is polysilicon (polycrystalline silicon). The NMOS structure is well-known in the art, and so a detailed explanation is omitted.

A first resistance-change portion 23 is provided between the drain region 21 and channel formation region 12. The first resistance-change portion 23 is an n− region of lower n-type impurity concentration than the drain region. On the first resistance-change portion 23 is placed the first charge accumulation portion 50. The first charge accumulation portion 50 is an ONO-layered insulating film, and includes a silicon oxide film (first oxide film) 41, silicon nitride film 42, and another silicon oxide film (second oxide film) 43.

The second resistance-change portion 26 is provided between the source region 22 and channel formation region 12. The second resistance-change portion 26 is an n− region with n-type impurity concentration lower than that of the source region 22. On top of the second resistance-change portion 26 is placed the second charge accumulation portion 52, with the same configuration as the first charge accumulation portion 50. The second charge accumulation portion 52 includes a silicon oxide film (first oxide film) 44, silicon nitride film 45, and another silicon oxide film (second oxide film) 46.

The first and second charge accumulation portions 50 and 52 may have a desired structure, depending upon the purpose and design of the memory device; for example, one or two or more of insulating films, selected from the insulating film group of silicon nitride film, aluminum oxide film ($Al_2O_3$), and hafnium oxide film ($HfO_x$), may be provided between first and second oxide films (41 and 43, or 44 and 46) of silicon oxide or similar.

In this embodiment, the first and second charge accumulation portions 50 and 52 extend from above the first and second resistance-change portions 23 and 26 onto the respective side walls of the gate electrode 30, so that injected charge can be reliably accumulated and held.

The resistance-change portion and charge accumulation portion may be provided between the electrode of the drain region 21 or source region 22, and the channel formation region 12. In the illustrated embodiment, however, the resistance-change portion and charge accumulation portion are provided between the electrode of the drain region 21 and channel formation region 12, and another resistance-change portion and charge accumulation portion are provided between the electrode of the source region 22 and channel formation region 12, so that two bits of information can be written per memory cell.

Although not a necessary condition, it is preferable that the second oxide films 43 and 46 be provided in order to improve charge holding characteristics.

The nonvolatile semiconductor memory records information through the accumulation of charge in the first and second charge accumulation portions 50 and 52, and through the neutralization of charge.

Now, the recording of information to the first charge accumulation portion 50 in the vicinity of the drain region 21 is described, referring to Table 1 and FIG. 3.

TABLE 1

|  | Source | Gate | Drain |
| --- | --- | --- | --- |
| Write | 0 | +Vgw | +Vdw |
| Read | +Vsr | +Vgr | 0 |
| Erase | 0 | +Vge | +Vde |

A positive voltage (+Vsr) is applied to the source region 22, a positive voltage (+Vgr) is applied to the gate electrode 30, and the drain region 21 is set to ground voltage, to put the NMOS FET of the memory in the on state, and a source-drain current is caused to flow to read the information on the side of the drain region 21.

When electrons, as charge carriers, have accumulated in the silicon nitride film 42 of the first charge accumulation portion 50, the resistance of the first resistance-change portion 23 rises. As a result, a state is entered in which carriers are not readily supplied to the channel formation region 12, so that even if the NMOS FET is in the on state, a substantial current does not flow between the source 22 and drain 21. This state is taken to be the logical value "0".

On the other hand, when electrons, as charge carriers, have not accumulated in the first charge accumulation portion 50, the resistance of the first resistance-change portion 23 does not change. As a result, when the NMOS FET of the memory is put into the on state, carriers are supplied to the channel formation region 12, and a substantial current flows. This state is taken to be the logical value "1". In this way, by utilizing differences in the value of the source-drain current, it is possible to reliably determine whether the logical value "1" or "0" has been written.

By causing electrons, as charge carriers, to be accumulated in the first charge accumulation portion 50 in advance, the information recorded in the first charge accumulation portion 50 is set to the logical value "0". The action of causing electrons to be accumulated in the first charge accumulation portion 50 is equivalent to erasing the information in the first charge accumulation portion. Erasure of information will be described later.

Figure 4:
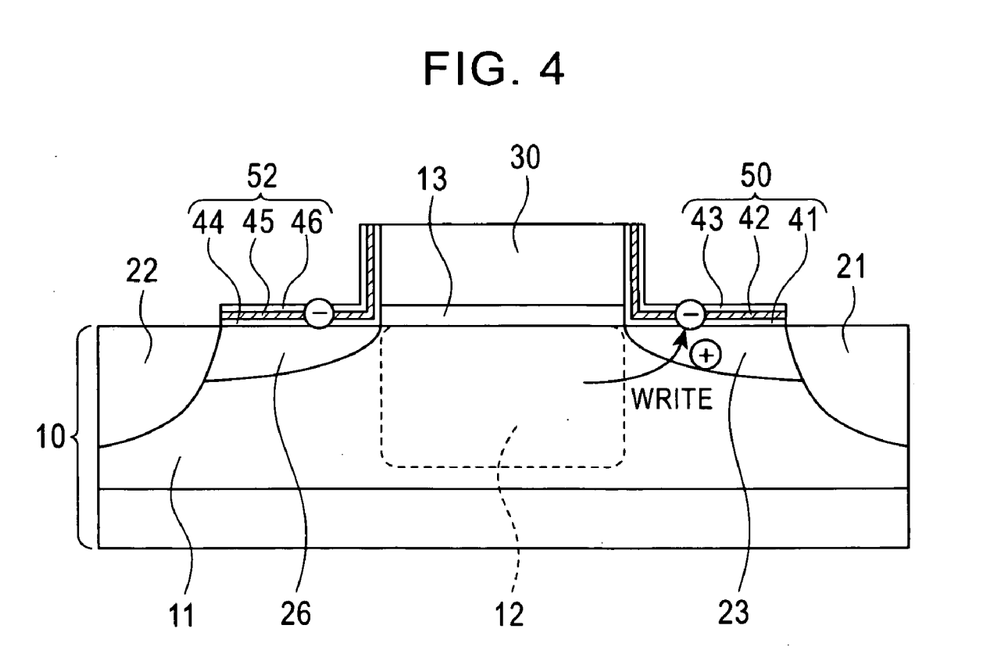
FIG. 4 is a schematic cross-sectional view used to explain the recording (writing) of information to the nonvolatile semiconductor memory of the first embodiment.

The writing of information to the first charge accumulation portion 50 is described, referring to FIG. 4. Writing of information is performed by neutralizing electrons, as charge carriers, which have accumulated in the first charge accumulation portion 50. A gate voltage (+Vgw) is applied to the gate electrode 30 of the nonvolatile semiconductor memory so as to cause weak inversion of the surface of the channel formation region 12, that is, a voltage below the NMOS FET threshold voltage is applied. It is preferable that the gate voltage (+Vgw) applied to the gate electrode 30 be a voltage in the proximity of the NMOS FET threshold voltage, for example approximately 1 V. By applying a high positive voltage (+Vdw) to the drain region 21 and grounding the source region 22, a source-drain current is caused to flow. It is preferable that the high voltage applied to the drain region 21 be approximately 3 to 10 V. In this embodiment, a voltage of 6 V is assumed.

Hot carriers are generated in the first resistance-change portion 23 by the source-drain current. Of the hot carriers generated, hot holes are attracted by electrons accumulated in the first charge accumulation portion 50 and neutralize the electrons. The injection of hot holes tends not to be directed toward the first charge accumulation portion 50 as the electrons in the first charge accumulation portion 50 are neutralized.

Figure 5:
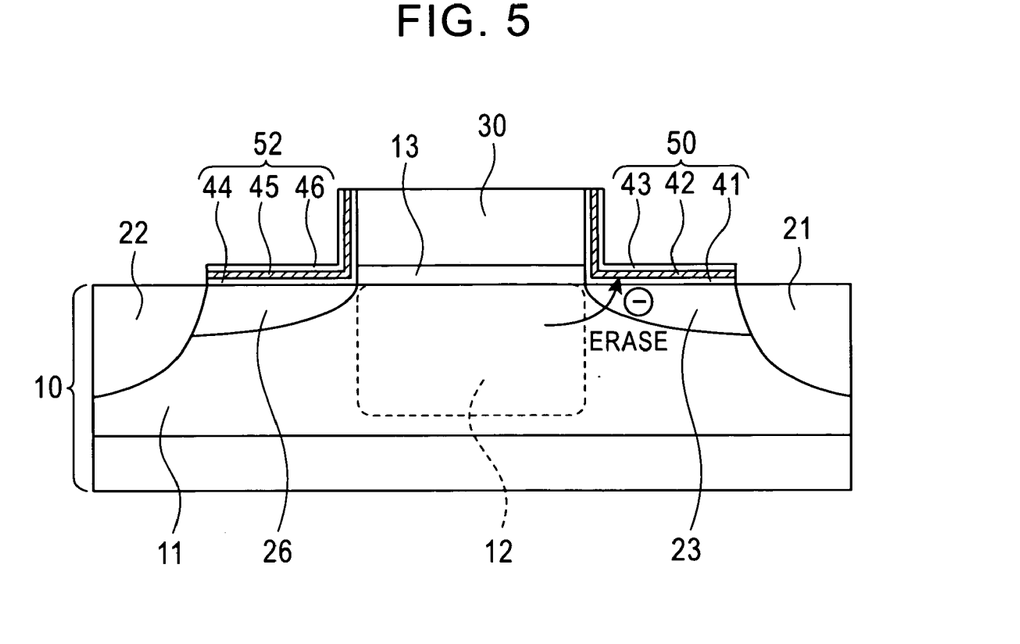
FIG. 5 is a schematic cross-sectional view used to explain the erasing of information in the nonvolatile semiconductor memory of the first embodiment.

Erasure of information in the first charge accumulation portion 50 is described with reference to FIG. 5. Information erasure, that is, electron injection, is performed by causing a current to flow between source and drain, so as to allow hot electrons among the hot carriers appearing in the first resistance-change portion 23 to be injected into the first charge accumulation portion 50. In information erasure, it is desirable that the drain voltage (+Vde) be approximately 3 to 10 V. In this embodiment, the drain voltage of 6 V is assumed. It is desirable that the gate voltage (+Vge) be approximately 3 to 12 V. In this embodiment, the gate voltage of 8 V is assumed.

In OTPROM (One Time Programmable Read-Only Memory) and other nonvolatile memory which admit information writing only once, information is erased at the time of product shipment, and a user writes information later. In this case, it is appropriate that information erasure, that is, charge injection, be performed using an external source of power, and that only information writing be performed using a voltage step-up circuit on the chip of the nonvolatile semiconductor memory. This is because information writing, that is, charge neutralization, has higher current efficiency than information erasure, that is, charge injection, and the OTPROM can take advantage of only the good current efficiency of information writing.

In this embodiment, the information writing, erasure, and reading has been described with respect to the first charge accumulation portion 50 near the drain region 21 of the nonvolatile semiconductor memory. By performing similar operations with the voltages in the drain region 21 and the source region 22 swapped, information can similarly be written, erased, and read in and from the second charge accumulation portion 52 in the vicinity of the source region 22.

A method of recording information in a memory cell array is described with reference FIG. 6 and Table 2. In the memory cell array, a plurality of the above-described nonvolatile semiconductor memory devices 101 (hereafter also called "memory cells") are arranged in a matrix shape.

TABLE 2

|  | BL(j) | WL(i) | BL(j + 1) | BL(j + 2) |
| --- | --- | --- | --- | --- |
| Write | 0 | +Vgw | +Vdw | Open |
| Read | +Vsr | +Vgr | 0 | Depend on |
| Erase | 0 | +Vge | +Vde | +Vdeih |

Figure 6:
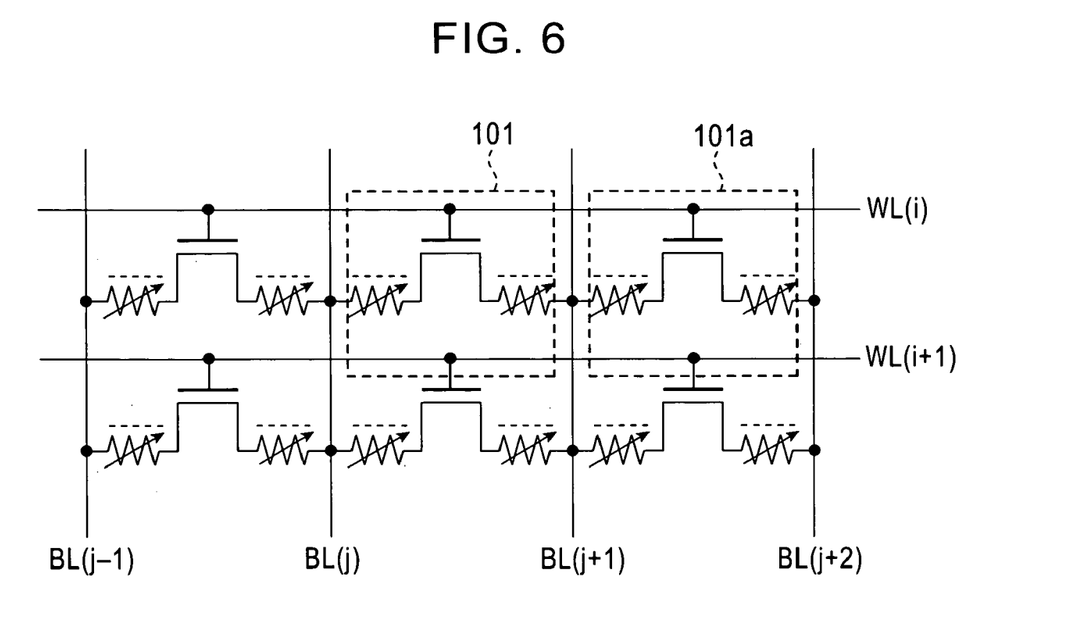
FIG. 6 schematically illustrates a memory cell array including a plurality of nonvolatile semiconductor memories.

FIG. 6 is used to explain the memory cell array. As shown in FIG. 6, the gate electrodes 30 in the memory cells 101 are connected to word lines WL(i) (where i is a natural number). The word lines WL(i) are parallel to each other and extend in the row direction. The drain regions 21 and source regions 22 in the memory cells 101 are connected to adjacent bit lines BL(j) (where j is a natural number) and bit lines BL(j+1), respectively. The bit lines BL(j) extend in the column direction intersecting the row direction. Other constituent elements used to drive the memory cell array (for example, driving circuits) are well-known in the art, and so drawings and detailed explanations are omitted.

Table 2 shows the conditions when information is recorded to a memory connected to the bit lines BL(j) and BL(j+1), and to the word line WL(i). By setting the voltages applied to the word line WL(i), bit line BL(j), and bit line BL(j+1) equal to the voltages applied to the gate electrode 30, source region 22, and drain region 21 of Table 1, information can be written to, erased from, and read from each memory cell. In order to suppress the erroneous writing of information to an adjacent memory cell 101a sharing a word line WL(i) and bit line BL(j+1) with the memory cell 101, the bit line BL(j+2) connected to the memory cell 101a can be left open. When erasing information, it is preferred that a prohibit voltage (+Vdeih) be applied to the bit line BL(j+2).

Second Embodiment

In the first embodiment, the nonvolatile semiconductor memory includes an NMOS FET as the transistor. However, the present invention is not limited to this structure. For instance, by forming a gate electrode, gate insulating film, and drain and source regions of p+ diffusion layers on an n well, the memory cell may include a PMOS FET (p-type Metal Oxide Semiconductor Field Effect Transistor). The second embodiment deals with this memory cell.

Figure 7:
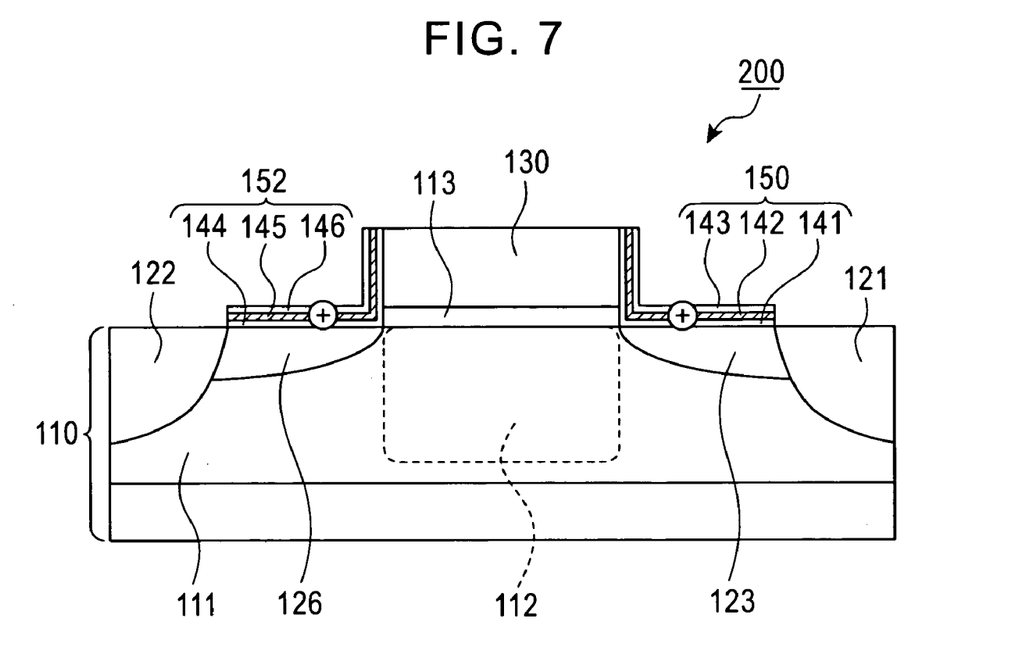
FIG. 7 is a schematic cross-sectional view of a nonvolatile semiconductor memory in a second embodiment of the present invention.

FIG. 7 is a schematic cross-sectional view of the nonvolatile semiconductor memory 200 that includes a PMOS FET as the transistor. In this embodiment, the first conductivity type is the n type, and the second conductivity type is the p type.

An n well 111 is formed in the surface-region side of the p-type or n-type silicon substrate 110. A drain region 121 as the first main electrode region, and a source region 122 as the second main electrode region are provided in the surface region of the n well 111. The drain region 121 and source region 122 are separated from each other by a prescribed distance and formed from a p+ diffusion layer.

A first resistance-change portion 123 is provided between the drain region 121 and channel formation region 112. The first resistance-change portion 123 is a p– region, with p-type impurity concentration lower than that of the drain region 121. A first charge accumulation portion 150 is placed on the first resistance-change portion 123. The first charge accumulation portion 150 is configured as an ONO-layered insulating film. The ONO-layered insulating film includes a silicon oxide film (first oxide film) 141, silicon nitride film 142, and another silicon oxide film (second oxide film) 143.

A second resistance-change portion 126 is provided between the source region 122 and channel formation region 112. The second resistance-change portion 126 is a p– region with p-type impurity concentration lower than that of the source region 122. A second charge accumulation portion 152, with the same configuration as the first charge accumulation portion 150, is placed on the second resistance-change portion 126. The second charge accumulation portion 152 includes a silicon oxide film (first oxide film) 144, silicon nitride film 145, and another silicon oxide film (second oxide film) 146.

The nonvolatile semiconductor memory 200 of the second embodiment differs from the nonvolatile semiconductor memory 101 of the first embodiment, described with reference to FIG. 3, in that the structure is PMOS with the conductivity types inverted. In other respects, the nonvolatile semiconductor memories 200 and 101 are similar to each other, and so an explanation for such respects is omitted.

In the following description, the recording of information to the first charge accumulation portion 150 near the drain region 121 is described with reference to FIG. 7 and Table 3.

TABLE 3

|  | Source | Gate | Drain | Sub(well) |
| --- | --- | --- | --- | --- |
| Write | 0 or Open | 0 or +Vgw | −Vdw | +Vbw |
| Read | 0 | 0 | +Vdr | +Vbr |
| Erase | +Vse | 0 | 0 | +Vbe |

By putting the source region 122 and gate electrode 130 at ground voltage and applying a positive voltage (+Vdr) to the drain region 121, information on the side of the drain region 121 is read.

When holes, as charge carriers, are accumulated in the silicon nitride film 142 of the first charge accumulation portion 150, the resistance of the first resistance-change portion 123 rises. As a result, a state is entered in which carriers are not easily supplied to the channel formation region 112, so that a sufficient amount of current does not flow. This state is taken to be the logical value "0".

On the other hand, when holes (or charge carriers) are not accumulated in the first charge accumulation portion 150, there is no change in the resistance of the first resistance-change portion 123. As a result, carriers are supplied to the channel formation region 112, and a sufficient amount of current flows. This state is taken to be the logical value "1". By utilizing differences in the magnitudes of the current flowing through the PMOS FET, it is possible to reliably determine which of the logical values "1" and "0" has been written.

By causing holes, as charge carriers, to be accumulated in advance in the first charge accumulation portion 150, the information recorded in the first charge accumulation portion 150 is set to the logical value "0". The action of causing accumulation of holes in the first charge accumulation portion 150 is equivalent to erasing the information of the first charge accumulation portion 150.

Figure 8:
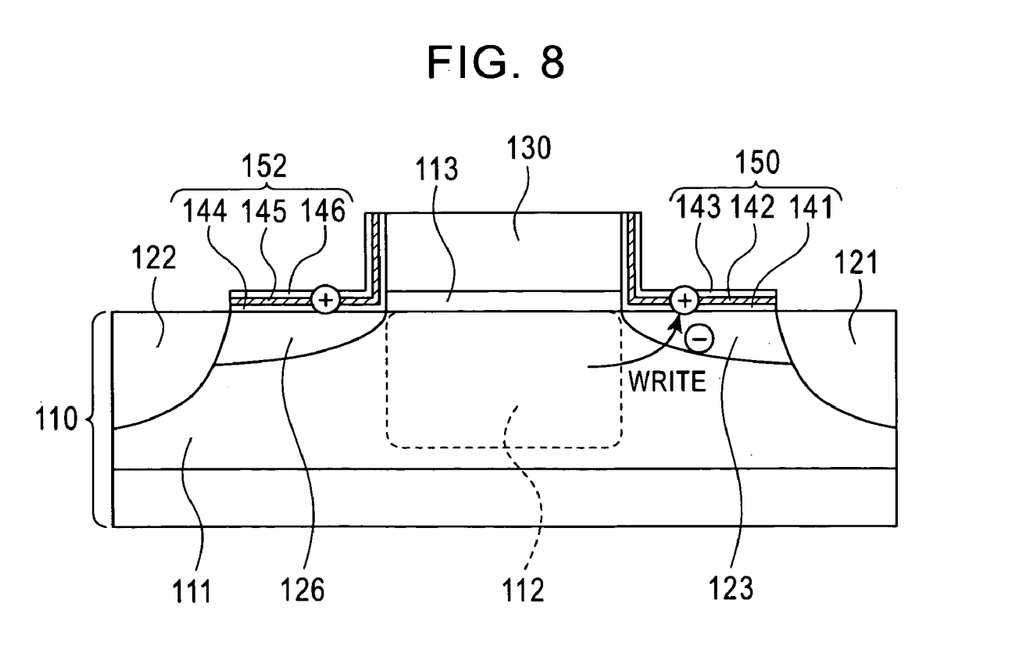
FIG. 8 is a schematic cross-sectional view used to explain the recording of information to the nonvolatile semiconductor memory of the second embodiment.

Writing of information to the first charge accumulation portion 150 is described with reference to FIG. 8. Information writing is performed by neutralizing holes (or charge carriers) accumulated in the first charge accumulation portion 150. A gate voltage (−Vgw) to cause weak inversion of the surface of the channel formation region 112, that is, a voltage below the PMOS FET threshold voltage, is applied to the gate electrode 130 of the nonvolatile semiconductor memory 200. It is preferable that the gate voltage (−Vgw) applied to the gate electrode 130 be a voltage in the proximity of the PMOS FET threshold voltage.

By applying a high negative voltage (−Vdw) to the drain region 121 and grounding the source region 122, a source-drain current is caused to flow.

When a voltage of approximately 1 V is applied to the n well 111, the gate voltage to cause weak inversion at the surface of the channel formation region 112 is the ground voltage, and the high negative voltage to be applied to the drain region 121 is between −2 V and −9 V (preferably −5 V).

Hot carriers appear in the first resistance-change portion 123 due to the source-drain current. Of the hot carriers which have appeared, the hot electrons are attracted by holes accumulated in the first charge accumulation portion 150, and neutralize the holes. The injection of hot electrons tends not to be directed toward the first charge accumulation portion 150 as the holes in the first charge accumulation portion 150 are neutralized.

Figure 9:
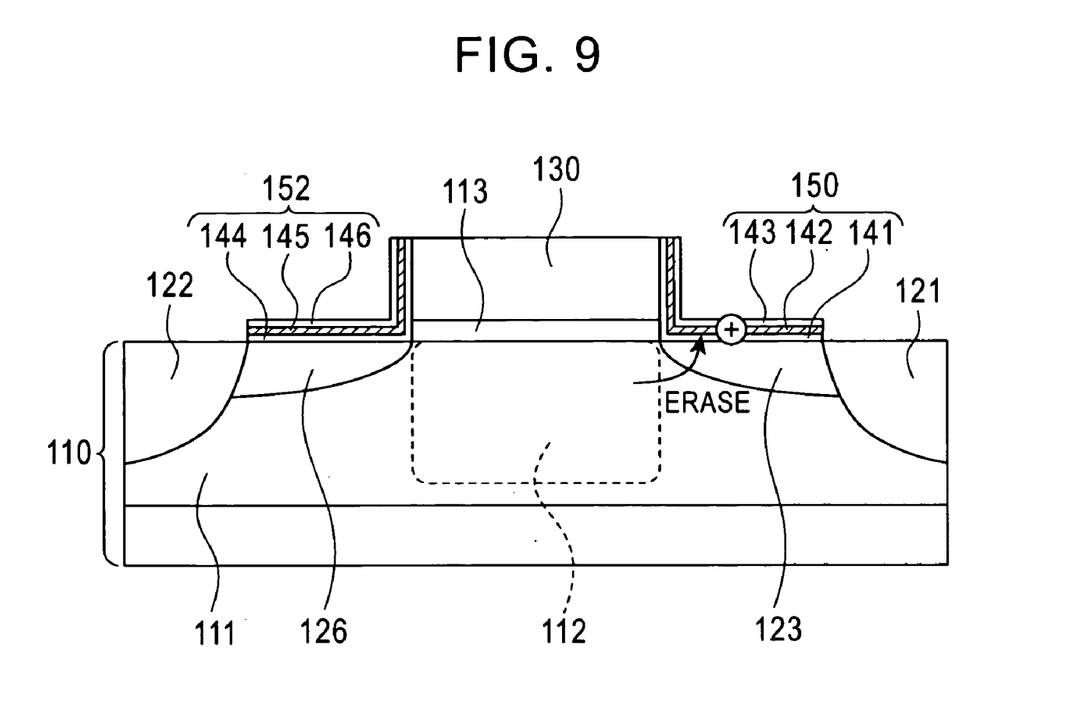
FIG. 9 is a schematic cross-sectional view used to explain the erasing of information in the nonvolatile semiconductor memory according to the second embodiment; and, FIG. 10 is a schematic view used to explain the source-drain current in the nonvolatile semiconductor memory according to a third embodiment of the present invention.

Referring now to FIG. 9, erasure of information in the first charge accumulation portion 150 is described. The injection of holes (i.e., information erasure) is performed by injecting hot holes into the first charge accumulation portion 150 among the hot carriers appearing in the first resistance-change portion 123 due to the current flowing between the source and drain. In information erasure, it is desirable that a voltage of approximately 3 to 10 V be applied to the n well 111 and source region, and that the drain region 121 and gate electrode 130 be set to ground voltage.

It should be noted that if the PMOS structure is employed and the OTPROM or similar is used as a nonvolatile memory which can be written only once, then the good current efficiency of information writing alone can be taken advantage of.

As described above, by lowering the gate voltage the current flowing between the source and drain can be suppressed, and information writing (i.e., charge neutralization) can be performed with good current efficiency. When information is erased by accumulating electrons in the charge accumulation portion, hot hole injection can no longer be performed when there are no further electrons in the charge accumulation portion. Hence when the charge accumulation portion includes an ONO-layered insulating film, degradation of the silicon oxide film in the charge accumulation portion due to hot electrons can be held to a minimum.

In OTPROMs in particular, information erasure, with poor current efficiency, is performed using an external source of power, and so the satisfactory current efficiency of charge neutralization alone can be utilized.

Third Embodiment

Figure 10:
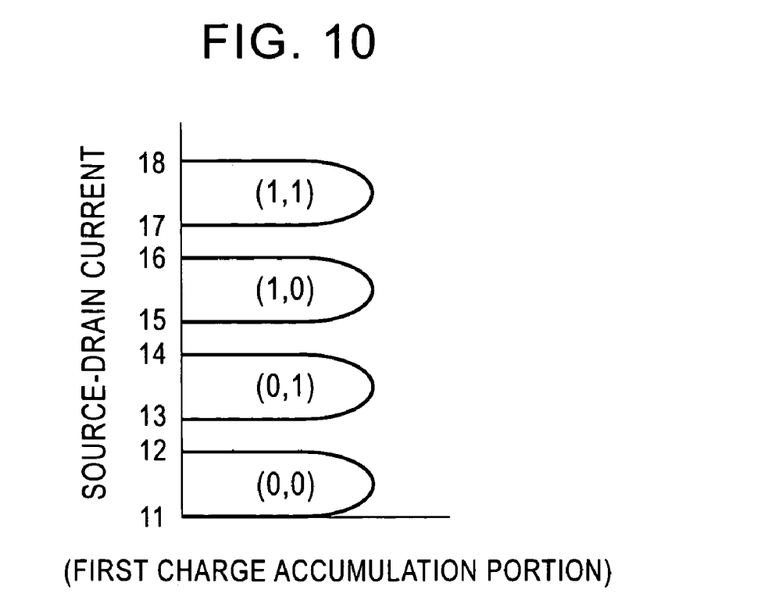

A third embodiment of the present invention will be described with reference FIG. 3 and FIG. 10. In this embodiment, a method of information recording is described when a nonvolatile semiconductor memory has an NMOS FET as its transistor. The structure of the nonvolatile semiconductor memory is similar to that shown in FIG. 3.

When electrons, as charge carriers, are accumulated in the silicon nitride film 42 of the first charge accumulation portion 50, the resistance of the first resistance-change portion 23 rises. As a result, a state is entered in which carriers are not readily supplied to the channel formation region 12, and a substantial current ceases to flow. This state is taken to be the logical value "0,0".

On the other hand, when electrons, as charge carriers, are not accumulated in the first charge accumulation portion 50, the resistance of the first resistance-change portion 23 is unchanged. As a result, carriers are supplied to the channel formation region 12, and a substantial current flows. This state is taken to be the logical "1,1" value.

By accumulating electrons as charge carriers in the first charge accumulation portion 50 in amounts intermediate between the charge amounts indicating the logical values "0,0" and "1,1", the source-drain current during reading can be made intermediate between those of the logical values "0,0" and "1,1". FIG. 10 shows the relation between the source-drain current during reading and the logical value recorded in the first charge accumulation portion 50. By adjusting the current flowing in the NMOS FET in four stages as shown in FIG. 10, the current value can be associated with logical values in the following manner: a current value between I1 and I2 indicates the logical value "0,0", a current value between I3 and I4 indicates the logical value "0,1", a current value between I5 and I6 indicates the logical value "1,0", and a current value between I7 and I8 indicates the logical value "1,1". Thus, two bits of information can be recorded in the first charge accumulation portion 50. Here, it should be assumed that I1<I2<I3<I4<I5<I6<I7<I8. These current values I1 through I8 indicate in relative terms the magnitude of the source-drain current. Thus various two-bit information can be recorded, according to the amount of charge accumulated in the first charge accumulation portion 50.

Similar to the first charge accumulation portion 50, two bits of information can also be recorded in the second charge accumulation portion 52. Hence two bits of information each can be recorded in the first charge accumulation portion 50 and in the second charge accumulation portion 52. Thus, four bits of information can be recorded in a single nonvolatile semiconductor memory cell.

Information writing is performed by neutralizing the electrons, as charge carriers, which are accumulated in the first charge accumulation portion 50. A high positive voltage (+Vdw) is applied to the drain region 21, and the source region 22 is set to ground voltage. Similar to the first embodiment explained referring to Table 1, a gate voltage such as to cause weak inversion in the surface of the channel formation region 12 is applied to the gate electrode 30. By applying a negative voltage to the gate electrode 30, or setting the gate electrode 30 to ground voltage, the channel is put into the off state, and by applying a high voltage to the drain region 21 hot carriers may be caused to appear through a tunnel current between bands. By repeating information recording, which is charge neutralization, and information reading, the amount of charge accumulated is controlled.

By using the above-described recording method, two bits of information can be recorded in one charge accumulation portion, so that approximately twice the amount of information can be recorded in a memory cell of the same size as in the prior art.

This application is based on a Japanese Patent Application No. 2004-200468 filed on Jul. 7, 2004 and the entire disclosure thereof is incorporated herein by reference.

What is claimed is:

1. A method of recording information in a nonvolatile semiconductor memory, after erasing information in the nonvolatile semiconductor memory by charge accumulation, said nonvolatile semiconductor memory including:
   a substrate of a first conductivity type;
   a transistor having a control electrode provided on said substrate with a first insulating film intervening, and a first main electrode region and second main electrode region which are a pair of diffusion regions provided in a surface region of the substrate, with impurities of a second conductivity type differing from said first conductivity type, said control electrode being located between said first and second main electrode regions;
   a channel formation region formed in said substrate and opposing said control electrode over the first insulating film;
   a first resistance-change portion of said second conductivity type, provided in the surface region of said substrate between one of said first and second main electrode regions and said channel formation region, an impurity concentration of said first resistance-change portion being lower than that of said one of first and second main electrode regions; and,
   a first charge accumulation portion provided on the first resistance-change portion, the first charge accumulation portion having a first insulating layer and capable of accumulation of charge; wherein
   when said first conductivity type is a p type and said second conductivity type is an n type, said method comprises:
   applying a high positive voltage to said one of said first and second main electrode regions;
   setting the other of said first and second main electrode regions to ground voltage; and,
   applying a positive voltage to said control electrode to cause weak inversion of said channel formation region; and,
   when said first conductivity type is the n type and said second conductivity type is the p type, said method comprises:
   applying a high negative voltage to said one of said first and second main electrode regions;
   setting the other of said first and second main electrode regions to the ground voltage; and,
   applying a negative voltage to said control electrode to cause the weak inversion of said channel formation region.

2. The method according to claim 1, wherein the transistor is an NMOS FET or PMOS FET.

3. The method according to claim 2, wherein the positive voltage applied to said control electrode is less than a threshold voltage of the transistor, and an absolute value of the negative voltage applied to said control electrode is less than the threshold voltage of the transistor.

4. The method according to claim 2, wherein the high positive voltage applied to said one of said first and second main electrode regions is approximately between 3V and 10 V.

5. The method according to claim 1, wherein said first insulating layer of said first charge accumulation portion is an ONO-layered insulating layer.

6. The method according to claim 1, wherein said first insulating layer of said first charge accumulation portion includes two oxide films and at least one of silicon nitride film, aluminum oxide film ($Al_2O_3$), and hafnium oxide film ($HfO_x$), provided between said two oxide films.

7. A method of recording information in a nonvolatile semiconductor memory, after information is erased in the nonvolatile semiconductor memory by charge accumulation, said nonvolatile semiconductor memory including:
   a substrate of a first conductivity type;
   a transistor having a control electrode provided on said substrate with a first insulating film intervening, and a first main electrode region and second main electrode region which are a pair of diffusion regions with impurities of a second conductivity type differing from said first conductivity type, the first and second main electrode regions being provided in the surface region of said substrate, said control electrode being located between said first and second main electrode regions;
   a channel formation region formed in said substrate and opposing said control electrode over the first insulating film;
   a first resistance-change portion of said second conductivity type, provided in the surface region of said substrate between one of said first and second main electrode regions and said channel formation region, with an impurity concentration of said first resistance-change portion being lower than that of said one of said first and second main electrode regions; and, a first charge accumulation portion provided on the first resistance-change portion, the first charge accumulation portion having a first insulating layer and capable of accumulation of charge; wherein when said first conductivity type is a p type and said second conductivity type is an n type, an amount of accumulation of charge in said first charge accumulation portion is controlled by repeating:

applying a high positive voltage to said one of said first and second main electrode regions, setting the other of said first and second main electrode regions to ground voltage, and applying a positive voltage to said control electrode, to neutralize charge; and, setting said one of said first and second main electrode regions to the ground voltage and applying a positive voltage to said the other of said first and second main electrode regions and to said control electrode, to read recorded information; and, when said first conductivity type is the n type and said second conductivity type is the p type, the amount of accumulation of charge in said first charge accumulation portion is controlled by repeating:

applying a high negative voltage to said one of said first and second main electrode regions, setting the other of said first and second main electrode regions to the ground voltage, and applying a negative voltage to said control electrode, to neutralize charge; and, setting said one of said first and second main electrode regions to the ground voltage and applying a negative voltage to said other of said first and second main electrode regions and to said control electrode, to read recorded information.

8. The method according to claim 7, wherein the transistor is an NMOS FET or PMOS FET.

9. The method according to claim 8, wherein the positive voltage applied to said control electrode is less than a threshold voltage of the transistor, and an absolute value of the negative voltage applied to said control electrode is less than the threshold voltage of the transistor.

10. The method according to claim 8, wherein the high positive voltage applied to said one of said first and second main electrode regions is approximately between 3V and 10 V.

11. The method according to claim 7, wherein said first insulating layer of said first charge accumulation portion is an ONO-layered insulating layer.

12. The method according to claim 7, wherein said first insulating layer of said first charge accumulation portion includes two oxide films and at least one of silicon nitride film, aluminum oxide film ($Al_2O_3$), and hafnium oxide film ($HfO_x$), provided between said two oxide films.

13. A method of recording information in a nonvolatile semiconductor memory, after erasing information in the nonvolatile semiconductor memory by charge accumulation, said nonvolatile semiconductor memory including:

a substrate of a first conductivity type;
a transistor having a control electrode provided on said substrate with a first insulating film intervening, and a first main electrode region and second main electrode region which are a pair of diffusion regions provided in a surface region of said substrate, with impurities of a second conductivity type differing from said first conductivity type, said control electrode being located between said first and second main electrode regions;
a channel formation region formed in said substrate and opposing said control electrode over the first insulating film;

a first resistance-change portion of said second conductivity type, provided in the surface region of said substrate between said first main electrode region and said channel formation region, an impurity concentration of said first resistance-change portion being lower than that of said first main electrode region;
a first charge accumulation portion provided on the first resistance-change portion, the first charge accumulation portion having a first insulating layer and capable of accumulation of charge;
a second resistance-change portion of said second conductivity type, provided in the surface region of said substrate between said second main electrode region and said channel formation region, an impurity concentration of said second resistance-change portion being lower than that of said second main electrode region; and,
a second charge accumulation portion provided on the second resistance-change portion, the second charge accumulation portion having a second insulating layer and capable of accumulation of charge;

wherein when said first conductivity type is a p type and said second conductivity type is an n type, and information should be recorded in said first charge accumulation portion, said method comprises:

applying a high positive voltage to said first main electrode region;
setting said second main electrode region to ground voltage; and,
applying a positive voltage to said control electrode to cause weak inversion of said channel formation region;

when said first conductivity type is a p type and said second conductivity type is an n type, and information should be recorded in said second charge accumulation portion, said method comprises:

applying a high positive voltage to said second main electrode region;
setting said first main electrode region to ground voltage; and,
applying a positive voltage to said control electrode to cause weak inversion of said channel formation region;

when said first conductivity type is the n type and said second conductivity type is the p type, and information should be recorded in said first charge accumulation portion, then said method comprises:

applying a high negative voltage to said first main electrode region;
setting said second main electrode region to the ground voltage; and,
applying a negative voltage to said control electrode to cause the weak inversion of said channel formation region; and when said first conductivity type is the n type and said second conductivity type is the p type, and information should be recorded in said second charge accumulation portion, then said method comprises:

applying a high negative voltage to said second main electrode region;
setting said first main electrode region to the ground voltage; and,
applying a negative voltage to said control electrode to cause the weak inversion of said channel formation region.

14. The method according to claim 13, wherein the transistor is an NMOS FET or PMOS FET.

15. The method according to claim 14, wherein said first insulating layer of said first charge accumulation portion includes two oxide films and at least one of silicon nitride film, aluminum oxide film ($Al_2O_3$), and hafnium oxide film ($HfO_x$), provided between said two oxide films.

16. The method according to claim 14, wherein the high positive voltage applied to said first main electrode region is approximately between 3V and 10 V and the high positive voltage applied to said second main electrode region is approximately between 3V and 10 V.

17. The method according to claim 13, wherein said first insulating layer of said first charge accumulation portion is an ONO-layered insulating layer.

18. The method according to claim 13, wherein the positive voltage applied to said control electrode is less than a threshold voltage of the transistor, and an absolute value of the negative voltage applied to said control electrode is less than the threshold voltage of the transistor.

* * * * *